United States Patent
Mix et al.

(10) Patent No.: US 6,710,266 B2
(45) Date of Patent: Mar. 23, 2004

(54) ADD-IN CARD EDGE-FINGER DESIGN/ STACKUP TO OPTIMIZE CONNECTOR PERFORMANCE

(75) Inventors: Jason A. Mix, Hillsboro, OR (US); Yun Ling, Portland, OR (US); Alok Tripathi, Beaverton, OR (US); Kent E. Mallory, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/205,725

(22) Filed: Jul. 26, 2002

(65) Prior Publication Data

US 2004/0016569 A1 Jan. 29, 2004

(51) Int. Cl.⁷ .......................... H05K 1/11; H01R 12/04
(52) U.S. Cl. ................. 174/261; 174/255; 361/788; 361/799; 438/62
(58) Field of Search ................. 174/260, 261, 174/255; 361/760, 777, 780, 785, 788, 792, 794, 799, 803; 439/60, 79, 59, 62

(56) References Cited

U.S. PATENT DOCUMENTS

| | | | | |
|---|---|---|---|---|
| 4,992,052 A | * | 2/1991 | Verhoeven | 439/62 |
| 5,319,523 A | * | 6/1994 | Ganthier et al. | 361/753 |
| 5,764,489 A | * | 6/1998 | Leigh et al. | 361/777 |
| 5,841,074 A | * | 11/1998 | Egan et al. | 174/250 |
| 6,425,766 B1 | * | 7/2002 | Panella | 439/59 |
| 6,486,414 B2 | * | 11/2002 | Kobayashi et al. | 174/261 |

* cited by examiner

Primary Examiner—Kamand Cuneo
Assistant Examiner—I B Patel
(74) Attorney, Agent, or Firm—Carrie A. Boone, P.C.

(57) ABSTRACT

A technique to simultaneously reduce high-frequency insertion loss and cross-talk for a multi-layered add-in card is disclosed. The technique is based on selective removal of ground and power planes beneath the edge fingers. This selective removal of power and ground planes removes excess capacitance at the edge fingers, lowering the insertion loss at high frequencies, while maintaining an impedance match with an associated connector. Simultaneously, the leftover metallic ground/power plane provides electromagnetic shielding and thus reduces the cross-talk between the differential pairs. Optimum performance of the connector with minimized insertion loss and cross-talk can be obtained for high-speed analog and digital applications.

20 Claims, 5 Drawing Sheets

ADD-IN CARD EDGE-FINGER DESIGN/ STACKUP TO OPTIMIZE CONNECTOR PERFORMANCE

FIELD OF THE INVENTION

This invention relates to motherboard add-in cards and, more particularly, to an add-in card used in high-frequency signaling operations.

BACKGROUND OF THE INVENTION

Printed circuit boards (PCBs) are single or multiple-layered platforms upon or within which printed conductors and electrical components are mounted. The components are connected together by the printed conductors that are either embedded within layers of the PCB or etched upon its surface. In addition to providing support, the PCB is a thermal conductive path for heat dissipation and an insulator for the conductors.

The PCB base or substrate is made from an insulator such as phenolic or fiberglass material. Electrical signals pass through the components along the conductors, which are made from copper or other highly conductive material. Some components are permanently affixed to the PCB, while others are connected using edge connectors, cartridges, and other support assemblies.

A conventional add-in card is a PCB that inserts into a connector on a receiving PCB, such as a motherboard of a personal computer. A terminating edge of the add-in card is inserted into the connector. One or both sides of the terminating edge include several closely spaced conductive fingers, known as edge fingers, extending transversely along its length. Formed along with the conductors and component mounting pads, the edge fingers may be gold-plated or otherwise coated with a non-corrosive material, such that insertion and removal does not damage the edge fingers. The edge fingers are spaced apart and typically are raised from their respective outer layer slightly.

The connector likewise includes plated surfaces against which the edge fingers make contact when the add-in card is inserted. The plated surfaces may flex to allow the edge fingers to frictionally engage with the connector. The connector may be permanent or non-permanent, such as to engage a removable add-in card. The terminating edge of the add-in card may be beveled to facilitate insertion into the connector. Like the motherboard, the add-in card may be single-sided, double-sided, or multi-layered.

The PCB and the support assemblies are designed to ensure that the electrical signals pass from the PCB to the add-on component, and back, without interruption of the signal transmission. Each component has an electrical characteristic, known as impedance, with which signal loss can be predicted. Impedance is the opposition to the flow of electrical current by the component, expressed in Ohms. Ideally, the PCB and its components have impedance characteristics that are identical to the connector.

Impedance mismatch can occur anywhere along a signal path, such as when the signal transitions between PCBs. Thus, for an add-in card connected to a motherboard, an impedance mismatch can occur when the signal passes from the motherboard to the connector, and again when the signal passes from the connector to the add-in card.

Insertion loss is the attenuation of signals as they pass through the connector. For a typical 100 Ohm differential bus (50 Ohm single-ended), impedance mismatch causes insertion loss, which is a function of frequency, and which becomes more pronounced at higher frequencies. High-performance connectors have been developed to ensure that signals reaching add-in cards at these speeds avoid failures due to high insertion loss. It is well known, however, that the performance of the connector alone does not prevent such failures. Instead, how the signal path transitions between the motherboard and the add-in card greatly impacts the connector performance.

In a multi-layered PCB, one or more layers, known collectively as reference layers, can be dedicated to power (power plane) or to ground (ground plane). Conventionally, the ground and power planes extend entirely throughout the add-in card, including the terminating edge. Sometimes, the ground/power planes adjacent to the edge fingers cause too much capacitance at the edge fingers, resulting in a severe impedance mismatch between the add-in card and the connector. The impedance mismatch can cause the signal to reflect back, resulting in signal distortion and possibly even data loss.

One solution is to completely remove the ground and power planes underneath the edge fingers. This can remove too much capacitance, however, and the impedance mismatch remains. Further, cross-talk between the signals may result. Cross-talk occurs when a signal from one input (or channel) crosses with a signal from another input (or channel). Cross-talk is particularly problematic in systems with high insertion loss, where those systems employ differential signaling.

Differential signals, or differential pairs, are groups of signals that are routed together and are approximately the same length. The signal value on each path is the difference between the individual voltages on each path (in contrast to measuring the voltage against a ground voltage). Differential signaling may be preferred where the signal source is far from the signal receiver or where electromagnetic interference (EMI) is a problem, such as where high-frequency signals are transmitted.

Add-in cards that transmit differential signals are particularly vulnerable to cross-talk, complicating the insertion loss problem. This is especially so when high-speed signals are transmitted through the add-in card. Thus, there is a continuing need to design an add-in card that minimizes insertion loss and cross-talk, particularly when high frequency signals are passing through the connector.

DETAILED DESCRIPTION

In accordance with the embodiments described herein, a multi-layered add-in card is disclosed in which the ground and/or the power plane are removed under selected edge fingers. The ground and power planes extend to the terminating edge beneath the remaining edge fingers. The selective removal of the ground and power planes reduces excess capacitance at the edge fingers, minimizing the possibility of increased insertion loss at high frequencies while both maintaining an impedance match with an associated connector and simultaneously minimizing cross-talk between the edge fingers. The performance of the connector is thus optimized.

In the following detailed description, reference is made to the accompanying drawings, which show by way of illustration specific embodiments in which the invention may be practiced. However, it is to be understood that other embodiments will become apparent to those of ordinary skill in the art upon reading this disclosure. The following detailed description is, therefore, not to be construed in a limiting sense, as the scope of the present invention is defined by the claims.

Figure 1A:
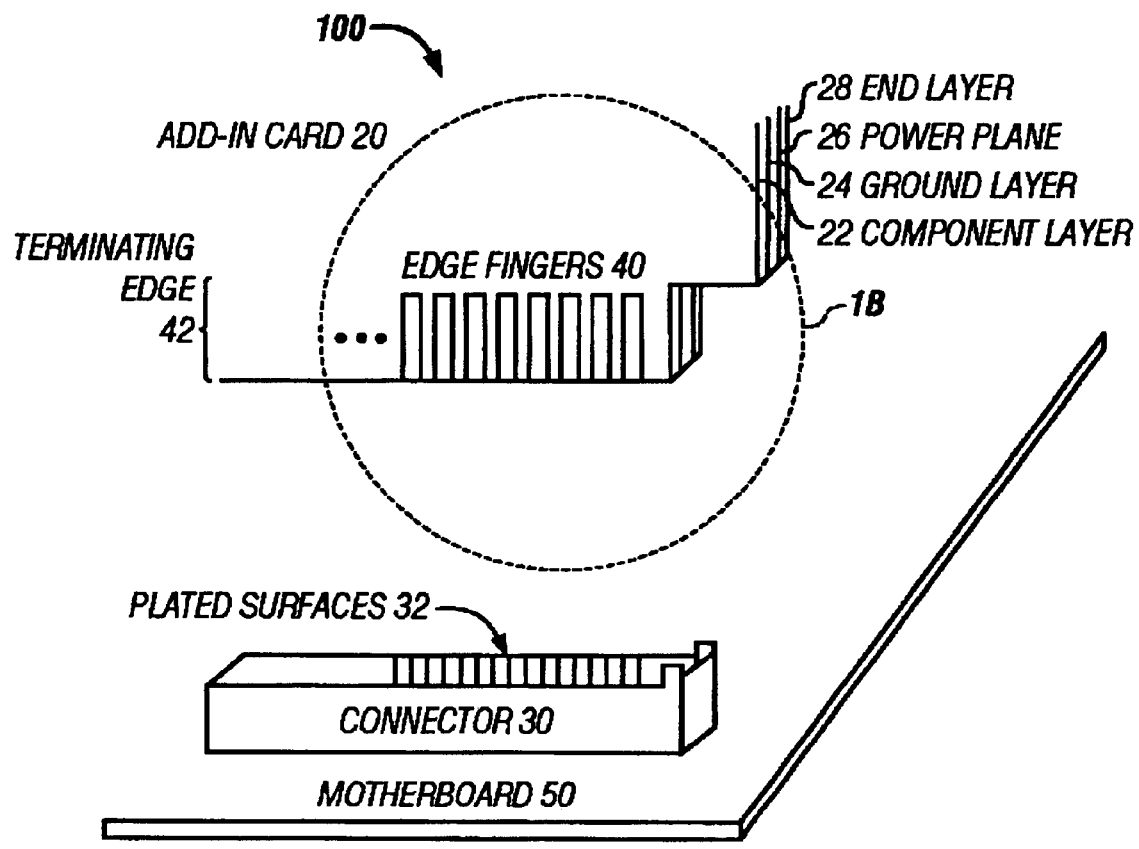
FIG. 1A is a perspective view of a system including a motherboard, a connector, and an add-in card according to one embodiment of the invention.
Figure 1B:
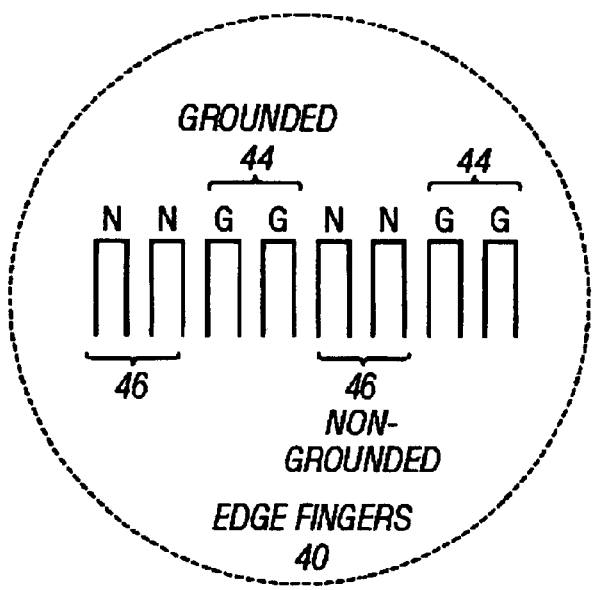
FIG. 1B is a detailed view of the edge fingers of the add-in card of FIG. 1A according to one embodiment of the invention.

In FIG. 1, according to one embodiment, a system 100 includes a connector 30, a motherboard 50, and an add-in card 20 in which ground and/or power planes have selectively been removed. The system 100 may be part of a typical processor-based system, such as a computer, a communications device, or other PCB-based platform, in which signals transmit between the motherboard and the add-in card through the connector.

The add-in card 20 and motherboard 50 are conventional multiple layer PCBs. Motherboard, as used herein, refers to any PCB including a connector for receiving another PCB. Add-in card refers to any PCB that is connectable to another PCB by engaging with a connector. These terms are commonly used by those of ordinary skill in the art and are not meant to limit the scope of the claims.

The motherboard 50, also known as the main circuit board, generally houses a central processing unit, memory, and other logic, and may be coupled to a power supply, a video display, a mass storage device, and so on. The add-in card comprises a component layer 22, upon which circuitry may be disposed, a ground plane 24, a power plane 26, and an end layer 28. The ground and power planes are collectively known as reference planes. The end layer may also be a component layer.

The multi-layered add-in card 20 includes a terminating edge 42, which is that portion of the add-in card to be received by the connector 30. Typically, each layer of the add-in card is the same shape and size, coupled in a sandwich arrangement, such that, for any circuit on the component layer 22, the ground plane 24 is adjacent to the circuit. Likewise, for a circuit on the end layer, the power plane 26 is adjacent to the circuit.

The add-in card includes edge fingers 40 extending transversely across the terminating edge of the component layer 22 and the end layer 28. The edge fingers 40 are plated extensions that connect to signal pads and/or circuitry on the add-in card and across which signals transmit between the add-in card and the motherboard. The connector includes plated surfaces 32 for making contact with the edge fingers when the add-in card is inserted.

A closer examination of the edge fingers 40 (see FIG. 1B) reveals alternating pairs of grounded 44 and non-grounded edge fingers 46. A pair of grounded edge fingers is next to a pair of non-grounded edge fingers, which is likewise next to a second pair of grounded edge fingers, and so on. The grounded edge fingers are connected to the ground plane 24, such as by connecting to ground pads on the component layer 22.

Figure 2:
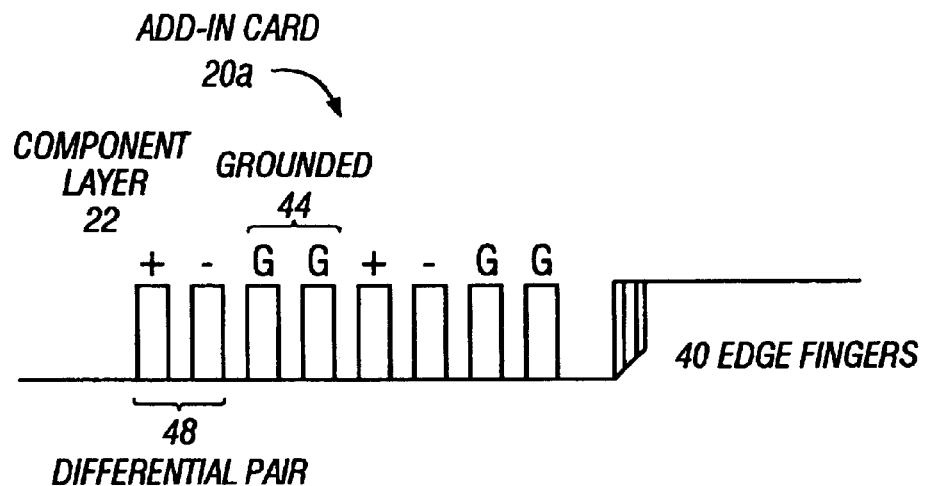
FIG. 2 is a detailed view of the terminating edge of the add-in card of FIG. 1A in which the non-grounded edge fingers are differential pairs according to one embodiment of the invention.

In one embodiment, the non-grounded edge fingers 46 connect to differential signal pads, as depicted in add-in card 20a of FIG. 2. A typical add-in card may have 4, 8, or 16 differential pairs on each outer layer. The differential signals of the component layer 22 are denoted using "+" and "−" in FIG. 2. The edge fingers 40 include alternating pairs of grounded edge fingers 44 and differential pairs 48. The ground plane 24 is adjacent to (or behind) the component layer and extends to the terminating edge 42. The power plane 26 is similarly adjacent to the ground plane, followed by the end layer.

As used herein, a portion of the add-in card or one of its layers is "aligned with" a second portion of the add-in card if a cross-sectional cutout of the add-in card including the one location also includes the other location. Typically, some portion of the ground plane 24 is aligned with a location on one of the other layers, as is some portion of the power plane 26.

Figure 3:
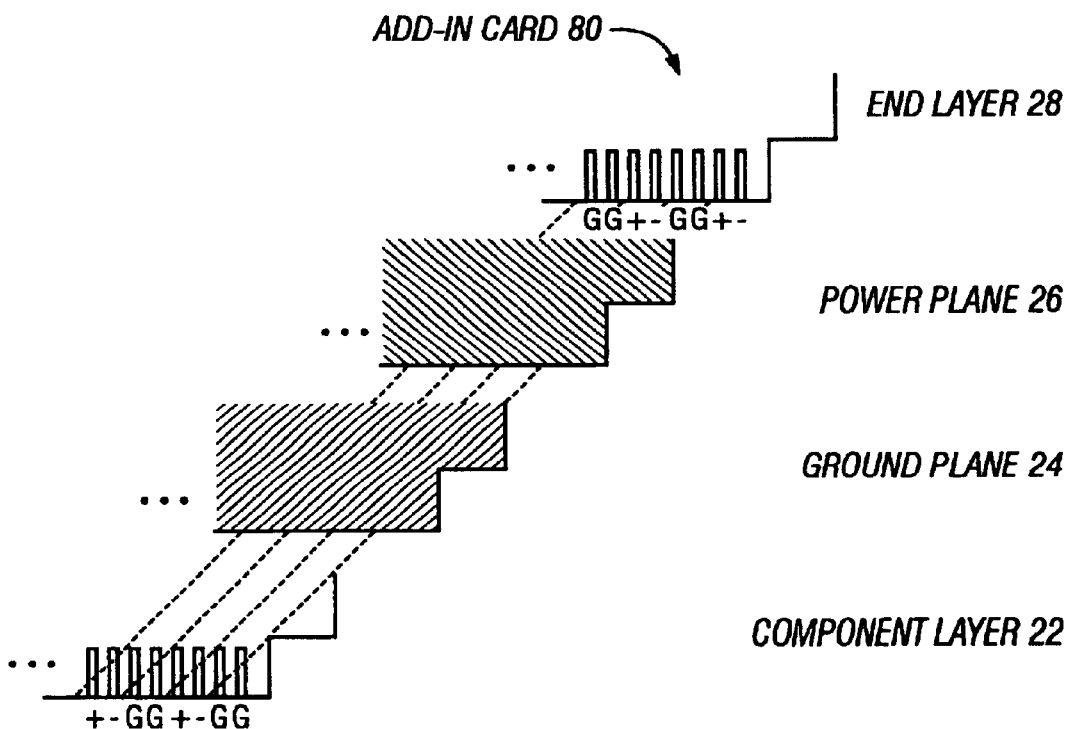
FIG. 3 is an exploded view of an add-in card according to the prior art.

Although not visible in FIG. 2, the end layer 28 also includes alternating pairs of grounded edge fingers and differential pairs. In one embodiment, the differential pairs of the component layer are not aligned with the differential pairs of the end layer. In FIG. 3, for example, the four layers of an add-in card 80, depicted separately, illustrate the non-alignment of differential pairs. Differential pairs on the component layer 22 are aligned with grounded pairs on the end layer 28. Likewise, differential pairs on the end layer are aligned with grounded pairs on the component layer. The ground plane 24 and the power plane 26 extend to the terminating edge of the add-in card.

In some environments, the ground and/or power planes along the terminating edge of the add-in card cause too much capacitance for the edge fingers. This causes a severe impedance mismatch with the connector 30. The impedance mismatch may lead to poor insertion loss response at high frequencies. In one embodiment, the measured insertion loss response of a connector with full ground and power planes in the add-in card increased after about 3 GHz.

Figure 4:
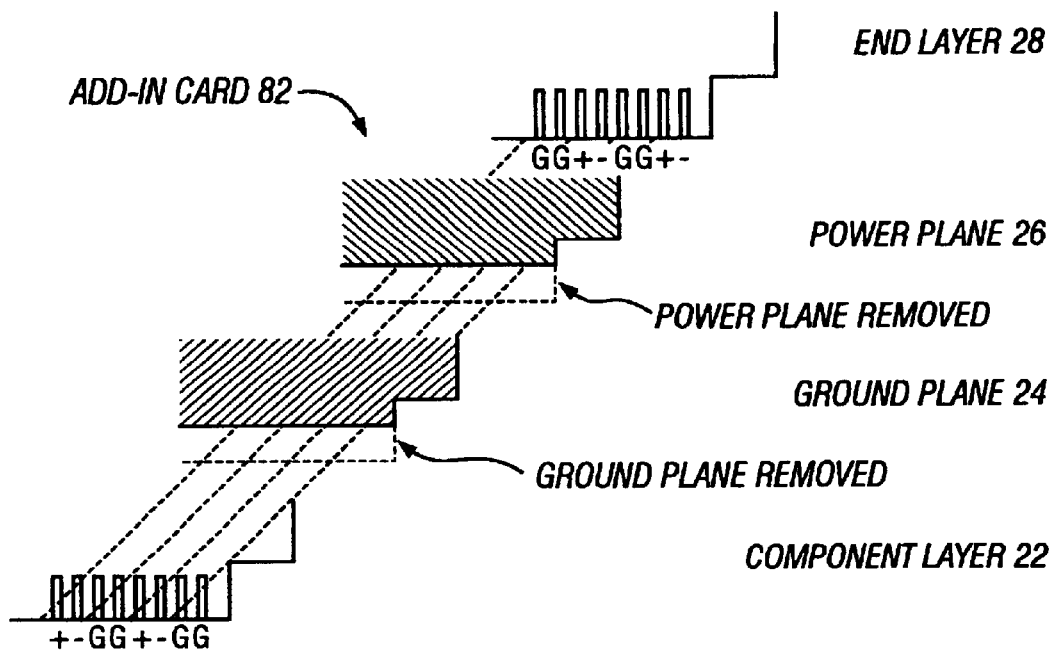
FIG. 4 is an exploded view of an add-in card in which the ground and power planes are removed at the terminating edge according to the prior art.

One solution is to completely remove the ground and power planes at the terminating edge 42, i.e., underneath the edge fingers 40 of the add-in card. Instead of having the ground and power planes extending entirely through the add-in card, the ground plane is stopped before the terminating edge, as depicted in the add-in card 82 of FIG. 4.

The ground plane extends from the top of the add-in card to the terminating edge. Likewise, a power plane 26 extends from the top of the add-in card to the terminating edge. Neither the ground plane nor the power plane is aligned with the edge fingers.

The removal of the ground and power planes at the terminating edge of the card significantly reduces excess capacitance and thus decreases insertion loss at the connector. However, additional problems arise. For one, removal of the ground planes underneath the edge fingers increases the cross-talk between signals on the opposite sides of the card and connector, particularly where high-speed signals are transmitted.

Further, by eliminating capacitance on the add-in card, an impedance mismatch between the card and the connector may nevertheless occur. Such mismatches are likely to result in signal reflection, distortion, and even data loss. Only the excess capacitance of the add-in card needs to be removed, no more and no less. Depending on the connector and add-in card stack-up design, completely removing the ground and/ or power planes underneath the edge fingers eliminates too much capacitance. This causes an impedance discontinuity because the impedance of the modified add-in card is now higher than the impedance of the associated connector.

Figure 5:
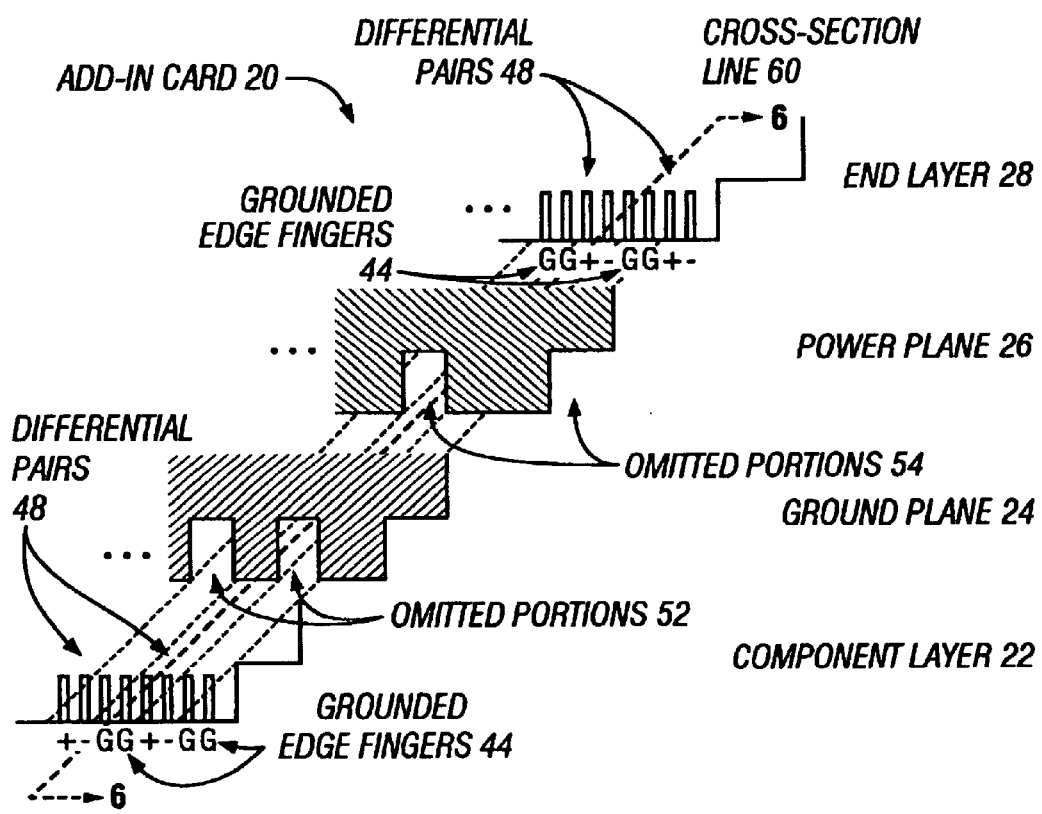
FIG. 5 is an exploded view of the add-in card of FIG. 1A in which the ground and power planes are selectively removed according to one embodiment of the invention.

Thus, according to one embodiment, a portion of the ground and power planes are selectively removed from the add-in card 20, as shown in FIG. 5. Rather than completely removing the ground and power planes underneath the edge fingers, only the ground and power planes underneath the differential pair edge fingers are partially removed.

As in prior examples, the ground plane of add-in card 20 is adjacent to the component layer, the power plane, and the end layer. In FIG. 5, instead of extending across the length of the add-in card, the ground plane 24 has cut or omitted portions 52 that correspond to the differential pairs 48 of the component layer 22. The ground plane is substantially not aligned with the differential pairs. However, the ground plane remains aligned with the grounded edge fingers 44.

Likewise, the power plane 26 includes cut or omitted portions 54 that correspond to the differential pairs 48 of the end layer 28. The power plane is thus substantially not aligned with the differential pairs along the end layer, but is aligned with the grounded edge fingers thereon. Both the ground and power planes continue to extend across the remainder of the add-in card.

The ground and power planes service both the component layer and the end layer, which may itself be a component layer, of the add-in card. Ground pads on either the component layer or the end layer can be connected to the ground plane, such as by vias interspersed cross-sectionally through the add-in card. Likewise, signal pads on either outer layer can be connected to the power plane.

Figure 6:
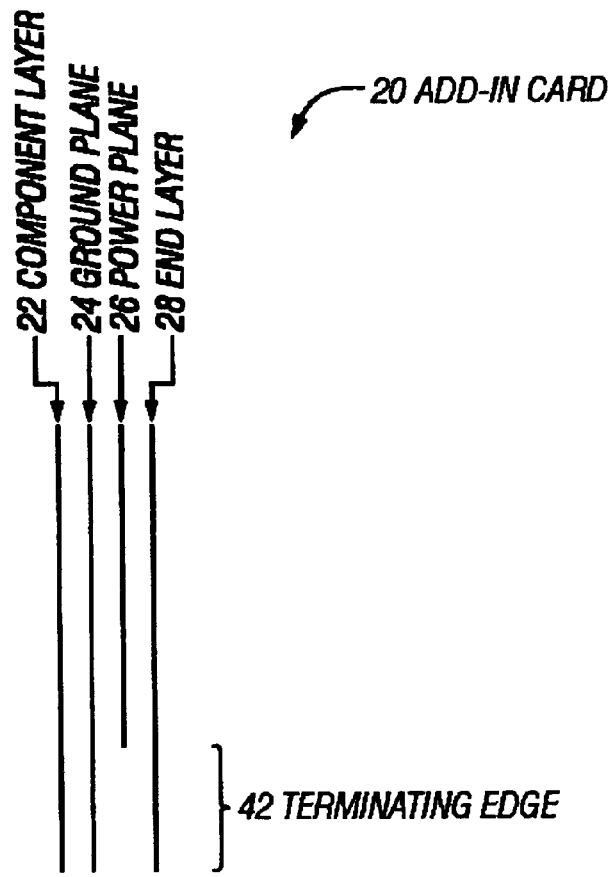
FIG. 6 is a cross-sectional view of the add-in card of FIG. 5, including ground and power planes, according to one embodiment of the invention.

FIG. 6 depicts a cross-section of the add-in card 20, as indicated by line 60 of FIG. 5. The cross-section line 60 is taken between grounded edge fingers 44 of the component layer 22 and between differential pairs 48 of the end layer 28. At the terminating edge 42, the ground plane 24 extends the entire length of the add-in card, but, because of the differential pairs on the end layer, the power plane stops at the terminating edge.

Figure 7:
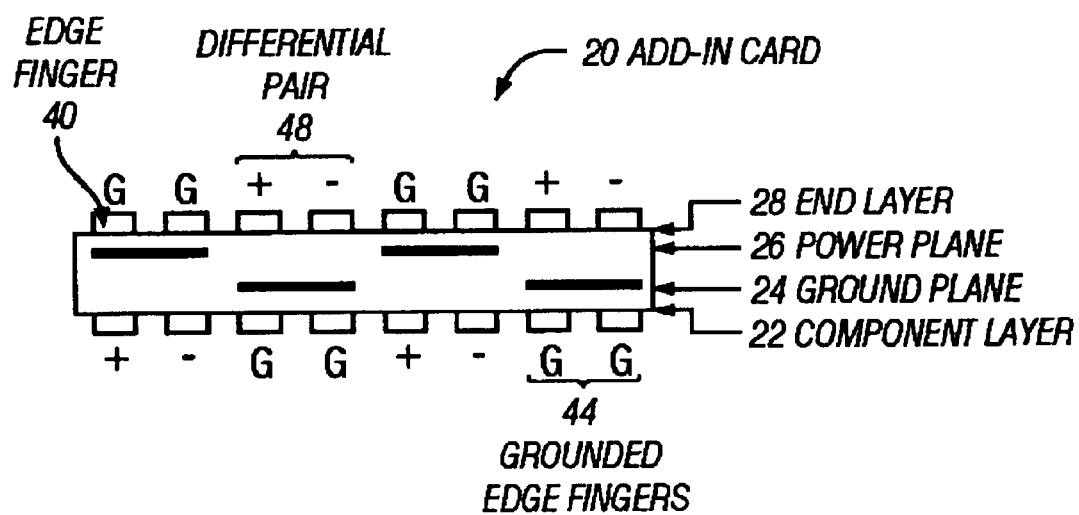
FIG. 7 is a bottom view of the add-in card of FIG. 5 according to one embodiment of the invention.

FIG. 7 is a bottom view of the add-in card 20 of FIG. 5. Differential pairs alternate with ground pairs, as shown. The ground plane is removed only where aligned with the differential pairs on the component layer. Where aligned with differential pairs on the end layer, the ground plane remains in place.

likewise, the power plane is removed only where aligned with the differential pairs on the end layer. The power plane remains aligned with differential pairs on the component layer. Thus, the ground and power planes on the opposite side of the add-in card adjacent to each differential pair remain intact.

In one embodiment, the selective removal of the ground and power planes greatly decreases the electromagnetic coupling between the differential pairs on the component layer, particularly as compared to completely removing the ground and power planes at the terminating edge. This improves connector performance, particularly where high-speed signals are transmitted, according to one embodiment. The selective removal of the ground and power planes reduces the edge finger capacitance without increasing the cross-talk between high-speed signals on opposite sides of the card.

In one embodiment, the size of the ground plane that is removed is variable, according to such factors as the size of the board, the speed of the signaling operations to be performed, the width of the edge fingers, the stack-up design of the add-in card, and other considerations. The ground plane is removed to optimize both the insertion loss and cross-talk, based on the electrical modeling of the connector and add-in card.

The selective, partial removal of the ground and power planes underneath the edge fingers does not increase the card fabrication cost, in one embodiment. The selective removal technique can be directly applied to the add-in card during manufacture, thus providing a low-cost way to improve the connector performance.

In FIG. 5, two grounded edge fingers are positioned between each differential signal pair. There are two grounded edge fingers to separate the adjacent differential pairs on each side of the connector and card. A shift of these differential pairs by two edge fingers on the opposite side of the card, such that differential pairs are not directly opposite one another, can be made. A similar adjustment of the connector can likewise be made.

Figure 8:
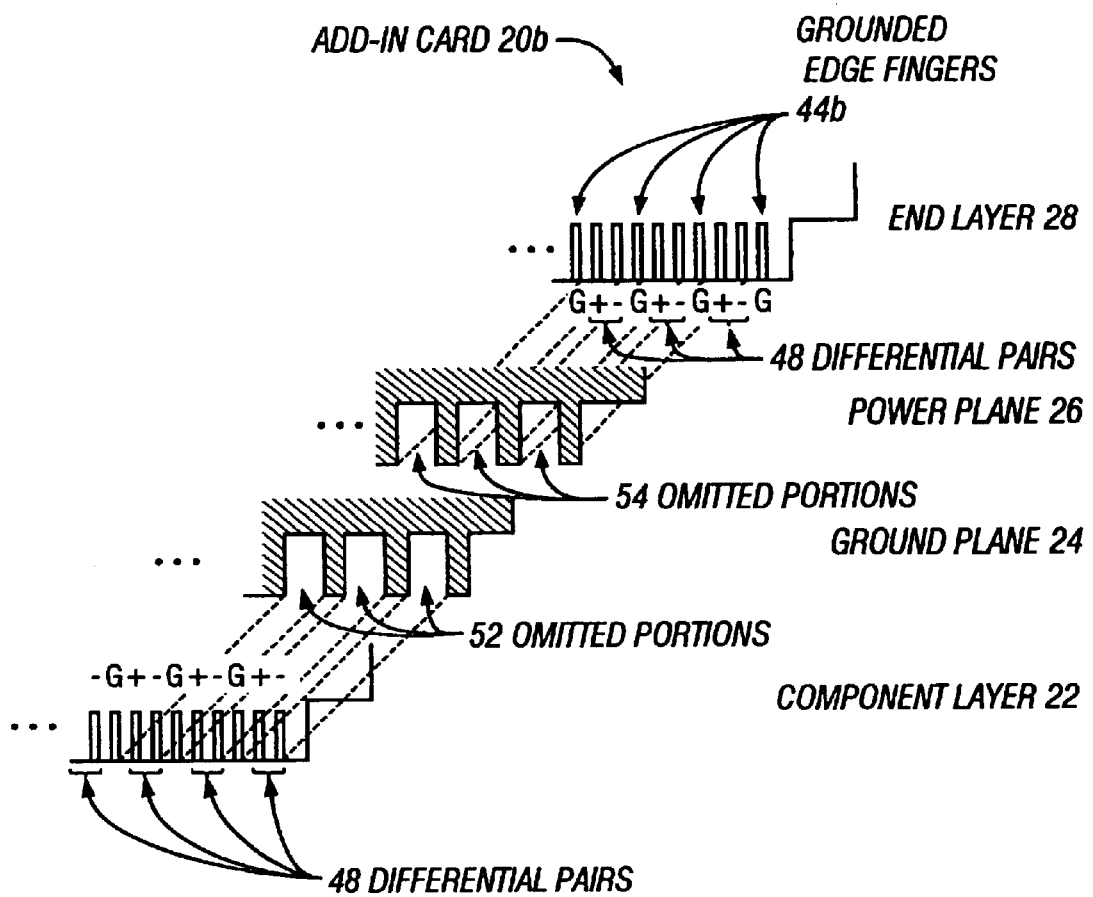
FIG. 8 is an exploded view of an add-in card in which a single grounded edge finger separates differential pairs, according to one embodiment of the invention.

It is possible, however, to have other variations of the illustrated scheme. For example, two adjacent grounded edge fingers, separating the adjacent differential pairs, may be combined together to form single "fat" grounded edge fingers. Or, as shown in FIG. 8, a single grounded edge finger 44b may separate differential pairs 48 rather than a pair of grounded edge fingers. Some of omitted portions 52 of the ground plane are aligned with omitted portions 54 of the power plane. In either variation, according to one embodiment, selective removal of the ground and power planes was effective to improve insertion loss of the connector. Other variations of the described grounded and non-rounded edge finger configuration are possible without departing from the spirit of the invention.

By selectively removing the ground planes underneath some of the edge fingers in an add-in card, the insertion loss of the connector can be improved. Further, by not removing the ground plane entirely at the terminating edge, the cross-talk performance of the add-in card can be optimized. The selective, partial removal of the ground planes underneath the edge fingers is not likely to increase the card fabrication cost. Since selective removal of the ground planes can be achieved during manufacture of the add-in card, this technique provides a low-cost way to improve the performance of the connector.

While the invention has been described with respect to a limited number of embodiments, those skilled in the art will appreciate numerous modifications and variations therefrom. It is intended that the appended claims cover all such variations as fall within the true spirit and scope of the invention.

We claim:

1. A multiple layer printed circuit board comprising:
   a terminating edge for coupling the printed circuit board to a connector;

grounded edge fingers along the terminating edge of one or more component layers;

non-grounded edge fingers along the terminating edge of the one or more component layers; and a ground plane adjacent to a component layer including the terminating edge, wherein a portion of the ground plane aligned with the non-grounded edge fingers of the component layer is removed.

2. The multiple layer printed circuit board of claim 1, further comprising:

a power plane adjacent to the ground plane including the terminating edge, wherein a section of the power plane is removed.

3. The multiple layer printed circuit board of claim 2, wherein the removed section of the power plane is aligned with the non-grounded edge fingers of an end layer.

4. The multiple layer printed circuit board of claim 3, wherein the grounded edge fingers and the non-grounded edge fingers are positioned along the terminating edge in alternating pairs.

5. The multiple layer printed circuit board of claim 4, wherein the ground plane is adjacent to the power plane and the removed portion of the ground plane is not aligned with the removed section of the power plane.

6. A system comprising:

an add-in card having a first impedance, the add-in card comprising:

a terminating edge;

grounded edge fingers along the terminating edge of one or more component layers;

non-grounded edge fingers along the terminating edge of the one or more component layers; and a reference plane adjacent to a component layer including the terminating edge; and a connector fixably attached to a motherboard, the connector electrically coupling the add-in card to the motherboard upon insertion of the add-in card, the connector having a second impedance;

wherein a portion of the reference plane aligned with the non-grounded edge fingers of the component layer is removed such that the first impedance is substantially similar to the second impedance during transmission of high-speed signals.

7. The system of claim 6, wherein the non-grounded edge fingers comprise differential signals.

8. The system of claim 6, wherein the reference plane is a ground plane.

9. The system of claim 8, wherein the add-in card further comprises a power plane adjacent to an end layer including the terminating edge, wherein a section of the power plane aligned with the non-grounded edge fingers of the end layer is removed.

10. The system of claim 6, wherein the reference plane is a power plane.

11. The system of claim 10, wherein the add-in card further comprises a ground plane adjacent to an end layer including the terminating edge, wherein a section of the ground plane aligned with the non-grounded edge fingers of the end layer is removed.

12. An add-in card comprising:

a component layer comprising a terminating edge, the terminating edge comprising grounded edge fingers and non-grounded edge fingers; and a ground plane sandwiched between the component layer and an end layer, the ground plane being in contact with the component layer including the terminating edge, wherein a portion of the ground plane aligned with the terminating edge and with the non-grounded edge fingers of the component layer is removed.

13. The add-in card of claim 12, further comprising:

a power plane sandwiched between the end layer and the ground plane, the power plane being in contact with the end layer including an end layer terminating edge;

wherein a section of the power plane aligned with the end layer terminating edge is removed.

14. The add-in card of claim 13, wherein the end layer comprises end layer grounded edge fingers and end layer non-grounded edge fingers and the removed section of the power plane is aligned with the end layer non-grounded edge fingers.

15. The add-in card of claim 14, wherein two grounded edge fingers are positioned on either side of at least one pair of non-grounded edge fingers.

16. The add-in card of claim 15, wherein the removed portion of the ground plane is not aligned with the removed section of the power plane.

17. A system comprising:

an add-in card comprising:

a first component layer and a second component layer, the layers each comprising a terminating edge with grounded edge fingers and non-grounded edge fingers; and a ground plane fixably coupled against the first component layer including its terminating edge, wherein a portion of the ground plane aligned with the non-grounded edge fingers of the first component layer is removed; and a connector for coupling the add-in card to a motherboard, the connector comprising plated surfaces against which the edge fingers make contact when the add-in card is inserted;

wherein an impedance match is maintained between the add-in card and the connector when a high-frequency signal is transmitted between the motherboard and the add-in card.

18. The system of claim 17, wherein the add-in card further comprises:

a power plane fixably coupled against the second component layer including its terminating edge;

wherein a part of the power plane aligned with the non-grounded edge fingers of the second component layer is removed.

19. An add-in card comprising:

a component layer comprising edge fingers, the edge fingers being grounded and non-grounded;

a ground layer fixably attached to the component layer, wherein the ground layer is aligned with all portions of the component layer except the non-grounded edge fingers.

20. The add-in card of claim 19, further comprising:

a second component layer including second non-grounded edge fingers;

a power layer fixably attached to the second component layer, wherein the power layer is aligned with all portions of the second component layer except the second non-grounded edge fingers.

* * * * *